United States Patent
Lee et al.

(10) Patent No.: US 7,592,227 B2
(45) Date of Patent: Sep. 22, 2009

(54) METHODS OF MANUFACTURING A SEMICONDUCTOR DEVICE

(75) Inventors: Yong-Sun Lee, Seoul (KR); Jai-Dong Lee, Suwon-si (KR); Bong-Hyun Kim, Incheon (KR); Man-Sug Kang, Suwon-si (KR); Jung-Hwan Kim, Suwon-si (KR); Hyun-Jin Shin, Seoul (KR); Won-Seok Yoo, Hwaseong-si (KR); Seung-Mok Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 448 days.

(21) Appl. No.: 11/481,928

(22) Filed: Jul. 7, 2006

(65) Prior Publication Data
US 2007/0010068 A1   Jan. 11, 2007

(30) Foreign Application Priority Data
Jul. 11, 2005   (KR) ............... 10-2005-0062166

(51) Int. Cl.
*H01L 21/336* (2006.01)
(52) U.S. Cl. ............... 438/265; 257/E21.301
(58) Field of Classification Search ........ 438/265, 438/773; 257/E21.301
See application file for complete search history.

(56) References Cited

U.S. PATENT DOCUMENTS 6,362,086 B2 * 3/2002 Weimer et al. ............ 438/591
6,605,521 B2 * 8/2003 Ajmera et al. ............ 438/595
6,660,587 B2 * 12/2003 Ahn et al. ............... 438/265

FOREIGN PATENT DOCUMENTS

| JP | 11-345970 | 12/1999 |
|---|---|---|
| KR | 10-2003-0011186 | 2/2003 |
| KR | 10-2005-0003533 | 1/2005 |

* cited by examiner

*Primary Examiner*—Chandra Chaudhari
(74) *Attorney, Agent, or Firm*—Harness, Dickey & Pierce, P.L.C.

(57) ABSTRACT

Example embodiments of the present invention relate to methods of manufacturing a semiconductor device. Other example embodiments of the present invention relate to methods of manufacturing a semiconductor device having a gate electrode. In the method of manufacturing the semiconductor device, a gate electrode may be formed on a semiconductor substrate. Damage in the semiconductor substrate and a sidewall of the gate electrode may be cured, or repaired, by a radical re-oxidation process to form an oxide layer on the semiconductor substrate and the gate electrode. The radical re-oxidation process may be performed by providing a nitrogen gas onto the semiconductor substrate while increasing a temperature of the semiconductor substrate to a first temperature to passivate a surface of the gate electrode under a nitrogen gas atmosphere, providing an oxygen gas onto the semiconductor substrate while increasing the temperature from a first temperature to a second temperature to perform a first oxidation process and/or performing a second oxidation process at the second temperature.

22 Claims, 5 Drawing Sheets

METHODS OF MANUFACTURING A SEMICONDUCTOR DEVICE

PRIORITY STATEMENT

This application claims the benefit of priority under 35 U.S.C. § 119 to Korean Patent Application No. 2005-62166, filed on Jul. 11, 2005, the contents of which are incorporated herein by reference in their entirety.

BACKGROUND OF THE INVENTION

1. Field of the Invention

Example embodiments of the present invention relate to methods of manufacturing a semiconductor device. Other example embodiments of the present invention relate to methods of manufacturing a semiconductor device having a gate electrode.

2. Description of the Related Art

Semiconductor memory devices may be categorized as volatile semiconductor memory devices (e.g., a dynamic random access memory (DRAM) device or a static random access memory (SRAM) device) or non-volatile semiconductor memory devices (e.g., a read only memory (ROM) device). The volatile semiconductor memory devices may lose data stored therein as a time elapses. The non-volatile semiconductor memory devices, which may have a slower date processing rate, may maintain data stored therein even though a power source may be turned off.

Because non-volatile semiconductor memory devices have unlimited storage capacity, a flash memory device (e.g., an electrically erasable and programmable ROM (EEPROM) device) storing data therein and outputting the data therefrom may be in demand. A memory cell in the flash memory device may generally include a floating gate having a vertically stacked structure formed on a silicon substrate.

FIG. 1 is a diagram illustrating a cross sectional view of a flash memory cell manufactured according to conventional methods.

Referring to FIG. 1, a gate electrode having a stacked structure in a flash memory cell may include a tunnel oxide layer 12 (e.g., a gate oxide layer) formed on a semiconductor substrate 10, a floating gate 14 formed on the tunnel oxide layer 12, a dielectric interlayer 16 (e.g., an oxide/nitride/ oxide (ONO) layer) formed on the tunnel oxide layer 12 and/or a control gate 22 formed on the dielectric interlayer 16. Reference numeral 24 represents a hard mask layer pattern, which functions as an etching mask.

The floating gate 14 may function as a tunneling source that affects electrical characteristics of charges in the tunnel oxide layer 12 when data is programmed into or erased from the memory cell.

The dielectric interlayer 16 may reserve, or maintain, charges accumulated in the floating gate 14.

The control gate 22 may include a polysilicon layer 18 and a tungsten silicide layer 20 in order that the control gate 22 achieves a relatively lower resistance. When a voltage is applied to the control gate 22, the control gate 22 may supply electrons to the semiconductor substrate 10. The electrons may migrate from the semiconductor substrate 10 to the floating gate 14 or electrons in the floating gate 14 may migrate to the semiconductor substrate 10.

The flash memory cell, including the stacked gate electrode, may store data by supplying electrons to the floating gate 14 or extracting electrons from the floating gate 14 when an appropriate voltage is applied to the control gate 20 and the semiconductor substrate 10.

An edge profile of the gate electrode may have an effect on electrical characteristics and the reliability of a transistor having the gate electrode. For example, when the gate electrode has an edge portion having a sharper profile caused by damage from an etching process, an intensive electric field may occur around the edge portion increasing the likelihood of a leakage current. The memory cell may have deteriorated electrical characteristics and degraded reliability thereof.

A re-oxidation process has been acknowledged in order to repair damage to a sidewall of the gate electrode and a surface of the semiconductor substrate. The damage may occur in an etching process for forming the gate electrode. The re-oxidation process may round off a lower edge portion of the gate electrode.

In the re-oxidation process, a surface of the semiconductor substrate 10, the sidewall of the floating gate 14 and the side wall of the control gate 22 may be oxidized by reacting silicon atoms with oxidants to form an oxide layer 26 on the surface of the semiconductor substrate 10, the sidewall of the floating gate 14 and the sidewall of the control gate 22.

The oxidants may penetrate into a lateral portion of the tunnel oxide layer 12 such that bird's beak phenomenon occurs at the lateral portion of the tunnel oxide layer 12. Bird's beak phenomenon results from a two-dimensional oxidation that may occur at an edge of a field oxide during the re-oxidation process. As such, oxidation extends into an active area at a surface underneath a silicon nitride forming a bird's beak. Because of the bird's beak, an effective area of the active region may be reduced. In the bird's beak region of the tunnel oxide layer 12, oxide thinning may occur. The tunnel oxide layer 12 may expand at the end portions thereof due to the bird's beak phenomenon.

When the tunnel oxide layer 12 expands at the lateral portion, the tunnel oxide layer 12 may have an increased overall thickness due to the gate electrode having a reduced width. It may be necessary to prevent, or retard, an increase in the overall thickness of the tunnel oxide layer caused by the bird's beak phenomenon.

When the re-oxidation process includes a thermal oxidation process (e.g., a dry oxidation process or a wet oxidation process), it may be difficult to prevent or retard an increase in the overall thickness of the tunnel oxide layer by controlling the bird's beak phenomenon. A radical re-oxidation process using radicals having a desired reactivity with the silicon atoms and the oxidants has been suggested.

According to the radical re-oxidation process, a hydrogen gas and an oxygen gas may be activated such that radicals of the hydrogen gas and the oxygen gas are produced. The radicals may react with the silicon atoms. In the radical re-oxidation process, an oxidation reaction may actively occur. An oxide layer having a uniform thickness may be formed irrespective of a profile of an oxidation reaction site. Dangling bonds in the oxide layer may be reduced such that the oxide layer may have an increased density thereof. Also, damage in the oxide layer may decrease, forming an oxide layer having desired mechanical characteristics.

FIG. 2 is a graph showing thermomechanical reaction stability of partial pressures of an oxygen gas relative to temperatures of a silicon substrate according to conventional methods.

Referring to FIG. 2, as a temperature of a silicon substrate increases, a partial pressure of an oxygen gas (e.g., a concentration of the oxygen gas), necessary for an oxidation process, may increase. When the temperature of the silicon substrate increases under a constant partial pressure of the oxygen gas, the concentration of the oxygen gas may be substantially lower than a desired concentration of the oxygen gas, which is needed to perform the oxidation process. As illustrated in FIG. 1, a reduction reaction, which vaporizes silicon of the silicon substrate into silicon oxide (in a vapor phase), may occur when the semiconductor substrate includes a silicon substrate. A surface of the silicon substrate may be slightly etched as a result of the reduction reaction. The etched silicon substrate may cause pitting at a lower edge portion of the floating gate 14. When pitting occurs around the silicon substrate, a haze may form over the silicon substrate.

In the radical re-oxidation process, the metal silicide layer pattern 20 may expand at a sidewall thereof to generate a hump at the sidewall of the metal silicide layer pattern 20. A bridge may form between adjacent gate electrodes in the memory cell.

SUMMARY OF THE INVENTION

Example embodiments of the present invention relate to methods of manufacturing a semiconductor device. Other example embodiments of the present invention relate to methods of manufacturing a semiconductor device having a gate electrode.

Example embodiments of the present invention provide methods of manufacturing a semiconductor device by preventing or reducing pitting and/or the formation of a hump.

According to example embodiments of the present invention, there is provided a method of manufacturing a semiconductor device. In the method of manufacturing the semiconductor device, a gate electrode may be formed on a semiconductor substrate. Damage in the semiconductor substrate and a sidewall of the gate electrode may occur during a manufacturing process (e.g., an etching process). The damage may be cured or repaired by a radical re-oxidation process wherein an oxide layer is formed on the semiconductor substrate and the gate electrode. The radical re-oxidation process may be performed by providing a nitrogen gas onto the semiconductor substrate while increasing a temperature of the semiconductor substrate to a first temperature to passivate a surface of the gate electrode under a nitrogen gas atmosphere. The radical re-oxidation process may also include performing a first oxidation process by providing an oxygen gas onto the semiconductor substrate while increasing the temperature of the semiconductor substrate from the first temperature to a second temperature and performing a second oxidation process at the second temperature.

In example embodiments of the present invention, the gate electrode may include a metal silicide layer.

In example embodiments of the present invention, the nitrogen gas may be provided onto the semiconductor substrate at a flow rate of about 30 standard liters per minute (slm) or greater.

In example embodiments of the present invention, the first temperature may be about 900° C. or less. In example embodiments of the present invention, the second temperature may be about 900° C. or greater.

In example embodiments of the present invention, the re-oxidation process may be performed by providing a nitrogen gas onto the semiconductor substrate at the second temperature when the oxygen gas is no longer provided onto the semiconductor substrate. The re-oxidation process may be performed prior to performing the second oxidation process.

In example embodiments of the present invention, the second oxidation process may be performed by continuously providing an oxygen gas and a nitrogen gas onto the semiconductor substrate.

According to example embodiments of the present invention, there is provided a method of manufacturing a semiconductor device. In the method of manufacturing the semiconductor device, a semiconductor substrate including a gate electrode may be placed into a reaction chamber. A nitrogen gas may be introduced into the reaction chamber while increasing a temperature of the reaction chamber to a first temperature to passivate a surface of the gate electrode. A first oxidation process may be performed by introducing an oxygen gas into the reaction chamber while increasing the temperature of the reaction chamber from the first temperature to a second temperature. A second oxidation process may be performed at the second temperature. An oxide layer may be formed on the semiconductor substrate and the gate electrode by the first and the second oxidation processes to cure, or repair, damage in the semiconductor substrate and/or a sidewall of the gate electrode.

In example embodiments of the present invention, the gate electrode may include a metal silicide layer.

In example embodiments of the present invention, the nitrogen gas may be introduced into the reaction chamber at a flow rate of about 30 slm or greater.

In example embodiments of the present invention, the first temperature may be about 900° C. or less.

In example embodiments of the present invention, the second temperature may be about 900° C. or greater.

In example embodiments of the present invention, the nitrogen gas may be introduced into the reaction chamber after stopping a supply of oxygen gas being introduced into the reaction chamber at the second temperature. The nitrogen gas may be introduced prior to performing the second oxidation process.

In example embodiments of the present invention, the second oxidation process may be performed by continuously introducing an oxygen gas and a nitrogen gas into the reaction chamber.

According to other example embodiments of the present invention, there is provided a method of manufacturing a semiconductor device. In the method of manufacturing the semiconductor device, a gate electrode having a stacked structure may be formed on a semiconductor substrate. The gate electrode may include a tunnel oxide layer pattern, a floating gate, a dielectric interlayer pattern and/or a control gate. The semiconductor and a sidewall of the gate electrode may be cured, or repaired, by a radical re-oxidation process to form an oxide layer on the semiconductor substrate and a surface of the gate electrode. The radical re-oxidation process may be performed by providing a nitrogen gas onto the semiconductor substrate while increasing a temperature of the semiconductor substrate to a first temperature to perform a passivation treatment under a nitrogen gas atmosphere, providing an oxygen gas onto the semiconductor substrate while increasing the temperature of the semiconductor substrate from the first temperature to a second temperature to perform a first oxidation process and/or performing a second oxidation process at the second temperature.

In example embodiments of the present invention, the nitrogen gas may be introduced onto the semiconductor substrate at a flow rate of about 30 slm or greater.

In example embodiments of the present invention, the first temperature may be about 900° C. or less.

In example embodiments of the present invention, the second temperature may be about 900° C. or greater. In an example embodiment of the present invention, the gate electrode may include a hard mask pattern formed on the control gate.

According to example embodiments of the present invention, a process temperature for a radical oxidation process may be altered by increasing the inner temperature of a reaction chamber through subsequent operations. The likelihood of a hump forming at the sidewall of the gate electrode and/or pitting occurring on a semiconductor substrate may be prevented or reduced.

BRIEF DESCRIPTION OF THE DRAWINGS

Example embodiments of the present invention will be more clearly understood from the following detailed description taken in conjunction with the accompanying drawings.

FIG. 1 is a diagram illustrating a cross sectional view of a flash memory cell manufactured according to conventional methods;

FIG. 2 is a graph illustrating thermomechanical reaction stability of partial pressures of an oxygen gas relative to temperatures of a silicon substrate according to conventional methods;

FIGS. 3 to 5 are diagrams illustrating cross sectional views of a method of manufacturing a non-volatile memory device according to example embodiments of the present invention;

FIG. 6 is a graph illustrating a radical re-oxidation process capable of preventing, or reducing, the formation of a hump on a sidewall of a tungsten silicide pattern according to example embodiments of the present invention; and FIG. 7 is a graph illustrating a radical re-oxidation process according to example embodiments of the present invention.

DESCRIPTION OF EXAMPLE EMBODIMENTS

Figure 1:
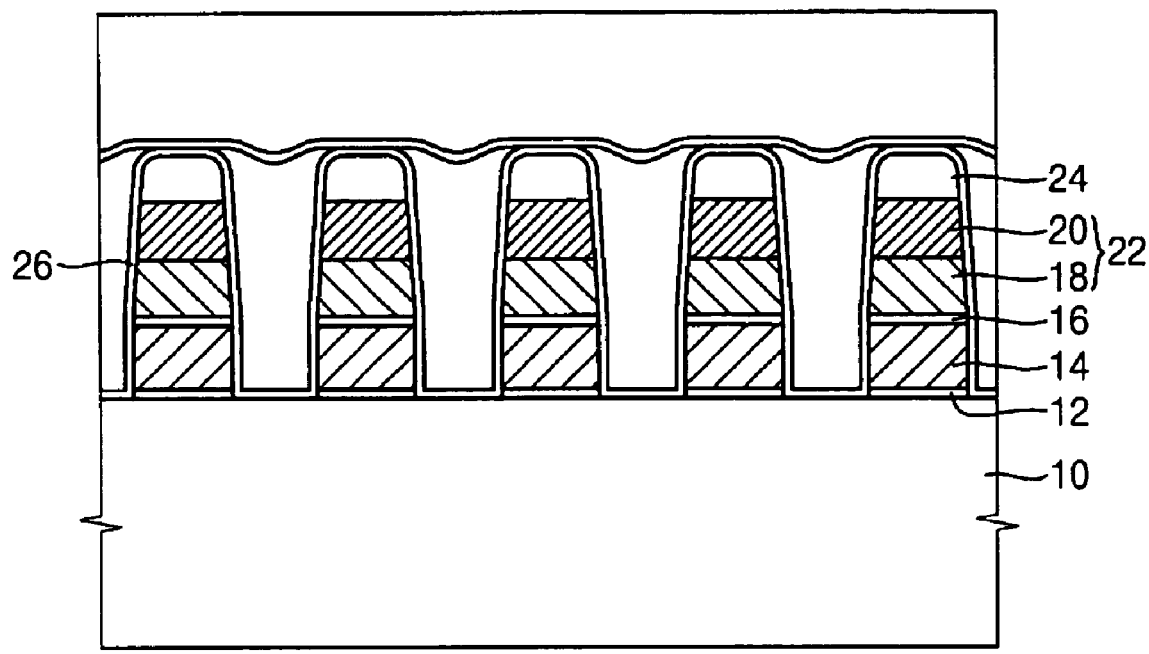
FIGS. 1-7 represent non-limiting, example embodiments of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like reference numerals refer to like elements throughout the description of the figures.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to methods of manufacturing a semiconductor device. Other example embodiments of the present invention relate to methods of manufacturing a semiconductor device having a gate electrode.

Figure 3:
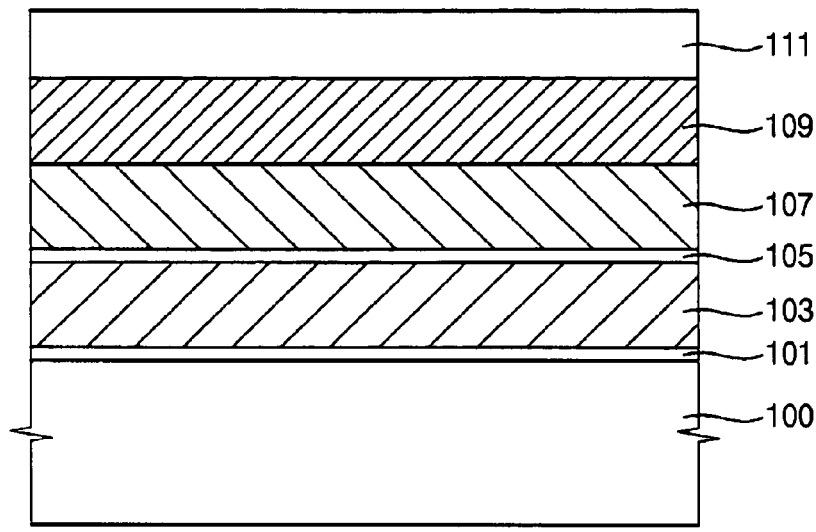
Figure 4:
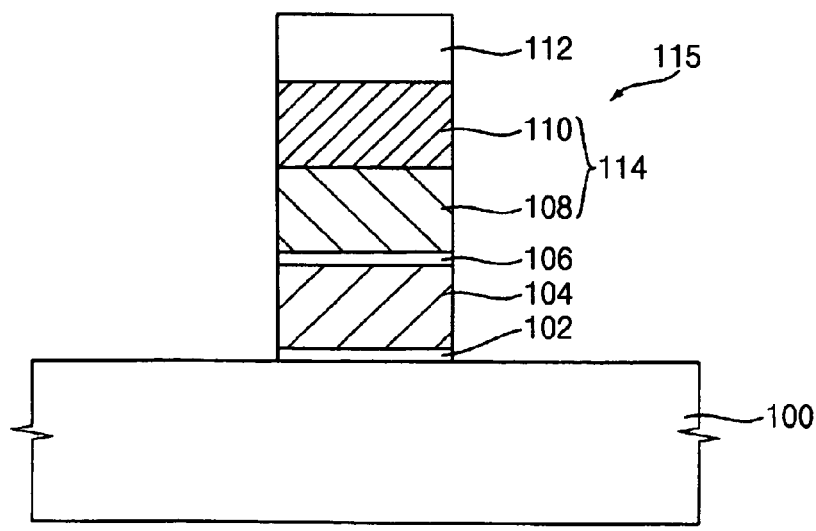
Figure 5:
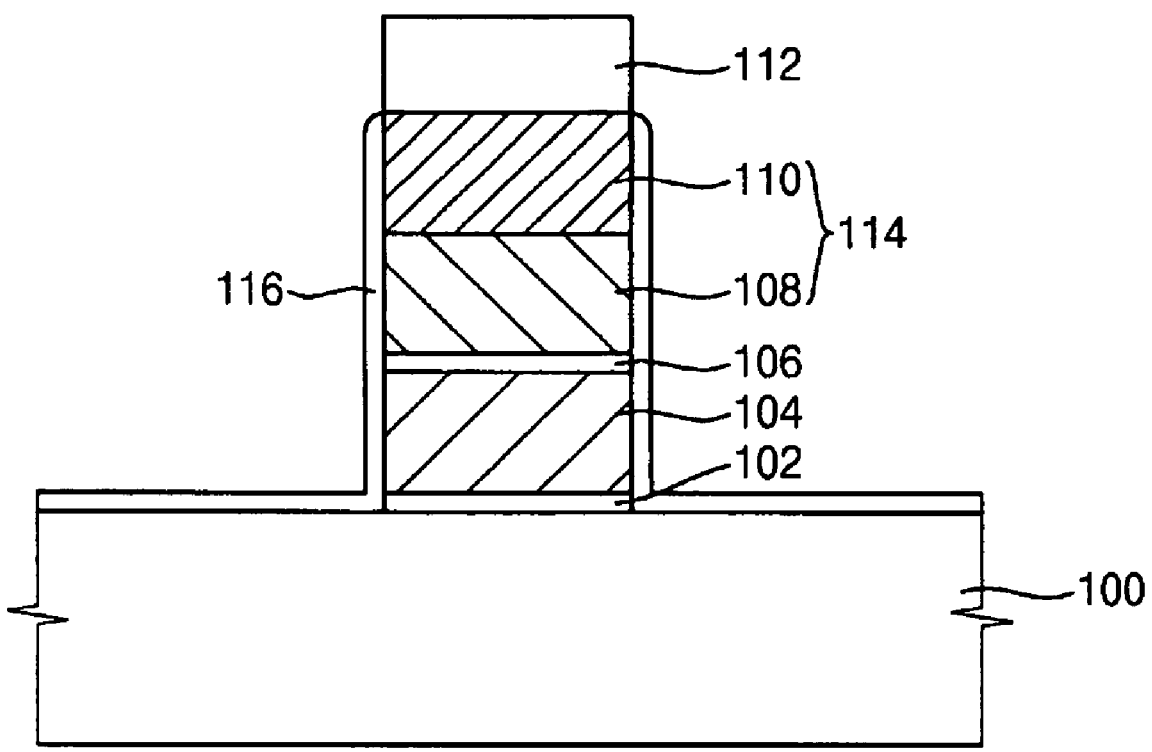

FIGS. 3 to 5 are diagrams illustrating cross sectional views of a method of manufacturing a non-volatile semiconductor device according to example embodiments of the present invention.

A semiconductor substrate 100 may be divided into an active region and a field region. The active region and the field region may be formed by an isolation process (e.g., a shallow trench isolation (STI) process). The semiconductor substrate 100 may be partially etched to form a trench. An oxide layer may be formed to fill the trench by a chemical vapor deposition (CVD) process or a thermal oxidation process. The oxide layer may be planarized until an upper portion of the semiconductor substrate 100 is exposed to form a field oxide layer filling the trench. For example, the oxide layer may be planarized by an etch back process, a chemical mechanical polishing (CMP) process or a combination process thereof.

In example embodiments of the present invention, the field region may be formed by a local oxidation of silicon (LOCOS) process. In other example embodiments of the present invention, the field region may be formed by a self-aligned shallow trench isolation (STI) process. The self-aligned shallow trench isolation process may simultaneously form a floating gate and the active region.

A tunnel oxide layer (e.g., a gate oxide layer) 101 may be formed on the semiconductor substrate 100. The tunnel oxide layer 101 may be formed by an oxidation process (e.g., a thermal oxidation process) or a CVD process.

A floating gate layer 103 may be formed on the tunnel oxide layer 101. A polysilicon layer may be formed on the tunnel oxide layer 101. N-type impurities may be implanted into the polysilicon layer at a relatively high concentration by a doping process, thereby forming the polysilicon layer having the N-type impurities. The doping process may include a $POCl_3$ diffusion process, an ion implantation process or an in-situ doping process. A portion of the polysilicon layer in the field region may be removed by a photolithography process to form the floating gate layer 103 on the tunnel oxide layer 101. Adjacent floating gate layers 103 may be electrically insulated from each other.

A dielectric interlayer 105 may be formed on the floating gate layer 103. The dielectric interlayer 105 may have an oxide/nitride/oxide (ONO) structure. The dielectric layer 105 may include a stacked structure having a lower oxide layer, a nitride layer and/or an upper oxide layer. The dielectric interlayer 105 having the ONO structure may be formed by a thermal oxidation process or a CVD process.

A polysilicon layer 107 doped with N-type impurities and a metal silicide layer 109 may be sequentially formed on the dielectric interlayer 105. A control gate layer, including the polysilicon layer 107 doped with the N-type impurities and the metal silicide layer 109, may be formed on the dielectric interlayer 105. In example embodiments of the present invention, the metal silicide layer 105 may be formed using a metal silicide (e.g., tungsten silicide, cobalt silicide, titanium silicide, tantalum silicide, etc.).

A hard mask layer 111 may be formed on the metal silicide layer 109. The hard mask layer 111 may have a single layer structure that includes an oxide layer or a nitride layer. Alternatively, the hard mask layer 111 may have a multi-layer structure that includes an oxide layer and a nitride layer.

Referring to FIG. 4, the hard mask layer 111 may be partially etched to form a hard mask layer pattern 112 on the metal silicide layer 109. The hard mask layer 111 may be partially etched by a photolithography process.

The control gate layer including the polysilicon layer 107 and the metal silicide layer 109, the dielectric interlayer 105 and the floating gate layer 103 may be sequentially and partially etched to form a gate electrode 115 on the semiconductor substrate 100. The control gate layer, the dielectric interlayer 105 and the floating gate layer 103 may be continuously and partially etched by a dry etching process to form the gate electrode 115 having a floating gate 104 and a control gate 114 in a memory cell region of the semiconductor substrate 100.

Reference numeral 102 denotes a tunnel oxide layer pattern, and reference numeral 106 denotes a dielectric interlayer pattern. Reference numeral 108 denotes a polysilicon layer pattern and reference numeral 110 denotes a metal silicide layer pattern.

Referring to FIG. 5, an oxide layer 116 may be formed on the semiconductor substrate 100 and the gate electrode 115, after forming the gate electrode 115 having a stacked structure. The oxide layer 116 may be formed by a re-oxidation process performed on a resultant structure including the gate electrode 115. The oxide layer 116 may be formed on an exposed portion of the semiconductor substrate 100 and a sidewall of the gate electrode 115.

The re-oxidation process may cure, or repair, damage to the sidewall of the gate electrode 115 and a portion of the semiconductor substrate 100 adjacent to the gate electrode 115. The re-oxidation process may round off a lower edge portion of the gate electrode 115 to increase electrical characteristics of the cell and stability thereof.

In example embodiments of the present invention, the re-oxidation process may include a radical oxidation process. The radical oxidation process may be performed under a pressure lower than a conventional oxidation process in order to decompose, or alter, a source gas into a radical. A hydrogen gas and an oxygen gas may be introduced into a reaction chamber under a process condition having a relatively higher temperature of about 850° C. to about 900° C., a relatively lower pressure of about 0.5 mTorr to about 2.0 mTorr and a desired partial pressure between the hydrogen gas and the oxygen gas. Radicals, for reaction with silicon, may be produced by the gases.

When the radical oxidation process is performed, an oxidation reaction may occur irrespective of a type of a material to be reacted with the radicals such that dangling bonds between valence electrons of silicon atoms and defects in the gate electrode may decrease. Because a more uniform oxidation reaction occurs irrespective of a profile of an oxidation reaction site, the oxide layer 116 may be formed having a more uniform thickness.

In the radical oxidation process, an oxidation reaction rate may be relatively higher at an initial stage. As the oxide layer 116 forms to a desired thickness thereof, a growth rate of the oxide layer 116 may decrease due to a lower penetrating rate of the radicals. As such, a length of a birds' beak may be controlled and an increase of a thickness of the tunnel oxide layer pattern 102 may be reduced.

As the radical oxidation process proceeds, a silicon pitting may occur to an upper face of the semiconductor substrate 100. A lateral face of the metal silicide layer pattern 110 may undesirably expand to form a hump of the metal silicide layer pattern 110. When the metal silicide layer pattern 110 includes a tungsten silicide layer pattern, the hump may be reduced or removed as follows.

Tungsten silicide may be reacted with oxygen to form a reaction product (e.g., tungsten oxide). As such, a lateral portion of the metal silicide layer pattern 110 may undesirably expand.

Tungsten silicide having an amorphous phase may be crystallized at a relatively higher temperature in the re-oxidation process. As such, grain boundaries may form in the tungsten silicide layer pattern. Grains in the polysilicon layer pattern 108 may migrate along the grain boundaries such that the lateral portion of the metal silicide layer pattern 110 may undesirably expand.

To avoid the hump of the metal silicide layer pattern 110, the semiconductor substrate may be loaded into the reaction chamber to perform a passivation treatment under a nitrogen atmosphere about a sidewall of the gate electrode 115. A nitrogen gas may be provided onto the semiconductor substrate 100 into the reaction chamber for the re-oxidation process. The nitrogen gas may have a flow rate of about 30 standard liters per minute (slm) or greater. The reaction between the metal silicide and the oxygen gas may not occur. The grains in the polysilicon layer pattern 108 may not migrate along the grain boundary in the metal silicide layer pattern 110.

Figure 6:
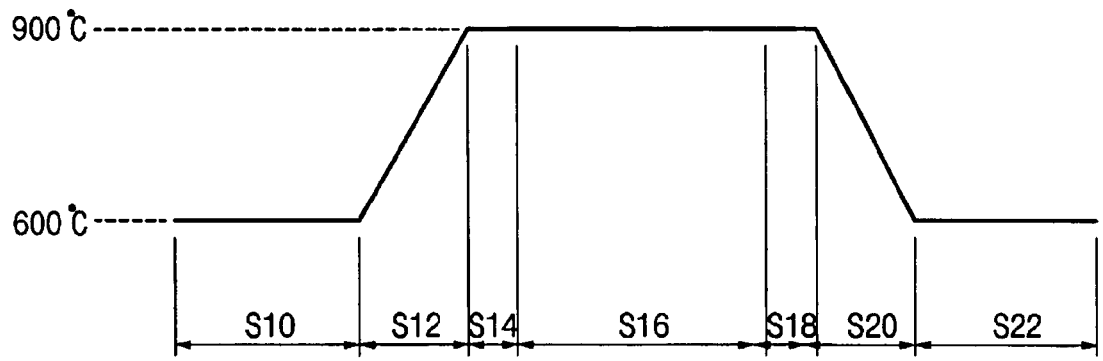

FIG. 6 is a graph illustrating a process of the radical re-oxidation process capable of preventing, or reducing, the formation of a hump on the sidewall of a tungsten silicide gate according to example embodiments of the present invention.

At S10, the semiconductor substrate 100, which includes the gate electrode 115 having a stacked structure, may be loaded into the reaction chamber having a temperature of about 600° C. for the radical re-oxidation process.

At S12, an inner temperature of the reaction chamber increases at a rate of 30° C. per minute until the inner temperature reaches about 900° C. While the inner temperature of the reaction chamber increases from about 600° C. to about 900° C., nitrogen gas may be introduced into the reaction chamber at a flow rate of about 30 slm. The nitrogen gas may be introduced into the reaction chamber because the semiconductor substrate 100 is loaded into the reaction chamber. The nitrogen gas may be introduced into the reaction chamber to perform the passivation treatment under the nitrogen atmosphere on the semiconductor substrate 100 in order to prevent or reduce oxidation of a surface of the semiconductor substrate 100.

At S14, while the reaction chamber maintains a temperature of about 900° C., the nitrogen gas may be continuously introduced into the reaction chamber for a desired time to reduce a temperature deviation in the reaction chamber.

At S16, the oxygen gas and the hydrogen gas may be introduced into the reaction chamber for a desired time after the nitrogen gas is no longer supplied into the reaction chamber. Oxygen radicals and hydrogen radicals may be produced by activating, or altering, the oxygen gas and the hydrogen gas, respectively. The oxygen radicals and the hydrogen radicals may be reacted with silicon atoms to form an oxide layer having a desired thickness.

At S18, the nitrogen gas may be introduced into the reaction chamber after the oxygen gas and the hydrogen gas are no longer supplied into the reaction chamber, thermally treating the oxide layer.

At S20, the inner temperature of the reaction chamber decreases at a rate of 30° C. a minute to reach at about 600° C., while the nitrogen gas is continuously introduced into the reaction chamber.

At S22, the semiconductor substrate 100 may be removed from the reaction chamber that maintains a temperature of about 600° C. while the nitrogen gas is introduced into the reaction chamber.

According to the radical re-oxidation process in the above-described processes, while the inner temperature of the reaction chamber reaches the process temperature, the nitrogen gas may be introduced into the reaction chamber at a flow rate of about 30 slm to perform the passivation treatment under the nitrogen atmosphere on the sidewall of the gate electrode 115. The oxidation process may be preformed at the process temperature. The hump may not form at the sidewall of the gate electrode 115.

When the oxygen gas has a lower concentration than a concentration necessary for an oxidation reaction and the semiconductor substrate 100 includes silicon substrate, a reduction reaction (e.g., a reaction between the silicon atom and the oxygen gas to vaporize silicon into silicon oxide) may occur to partially etch a surface of the semiconductor substrate 100. As a result of the partial etching of the surface of the semiconductor substrate, a pitting phenomenon may occur. When a concentration of the oxygen gas increases in order to overcome the pitting phenomena, the hump may form at the sidewall of the gate electrode 115.

In example embodiments of the present invention, the temperature of the reaction chamber may be adjusted, or altered, through the radical re-oxidation process for forming the oxide layer in order to prevent, or reduce, a hump from forming at the sidewall of the gate electrode and/or the silicon substrate from pitting. In the radical re-oxidation process, the nitrogen gas may be introduced into the reaction chamber to perform the passivation treatment under the nitrogen atmosphere about, or on, the surface of the gate electrode. In the radical re-oxidation process, the oxygen gas may be provided into the reaction chamber to augment the concentration thereof, before performing the oxidation process.

Figure 7:
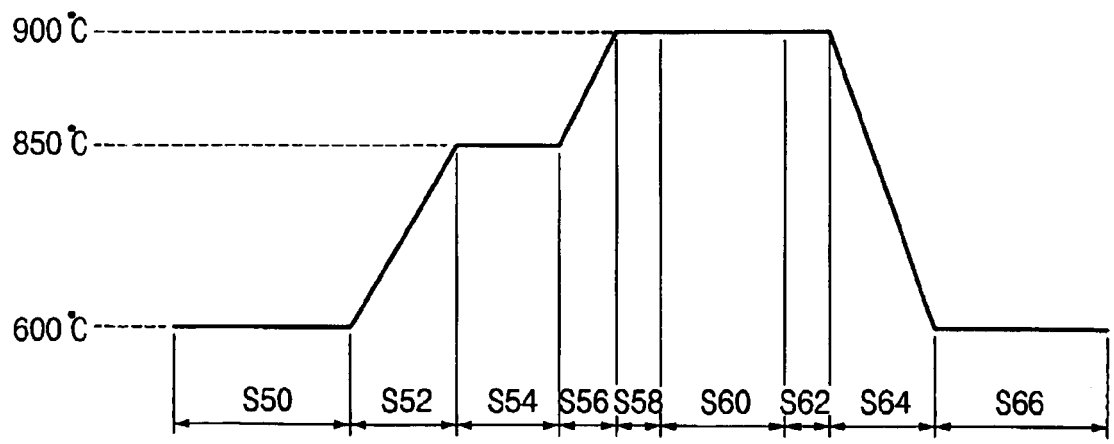

FIG. 7 is a graph illustrating a radical re-oxidation process according to example embodiments of the present invention.

Referring to FIGS. 5 and 7, the semiconductor substrate 100 that includes the gate electrode 115 having the stacked structure may be loaded into the reaction chamber having a temperature of about 600° C. at S50.

At S52, the inner temperature of the reaction chamber may increase at a rate of about 30° C. per minute to reach to a first temperature (e.g., about 850° C.). As the inner temperature of the reaction chamber increases, the nitrogen gas may be provided into the reaction chamber at a flow rate of 30 slm.

The nitrogen gas may be continuously introduced to reaction chamber after the semiconductor substrate 100 is loaded into the reaction chamber. The nitrogen gas may prevent or reduce the semiconductor substrate 100 from being oxidized at a surface thereof. A surface of the gate electrode 115 may be passivated under the nitrogen atmosphere to prevent or reduce the metal silicide layer pattern 110 from undesirably expanding at a lateral portion thereof After the inner temperature of the reaction chamber increases to about 850° C., the nitrogen gas may be introduced into the reaction chamber for a desired length of time to reduce the temperature deviation in the reaction chamber at S54.

At S56, while the oxygen gas is provided into the reaction chamber, the inner temperature of the reaction chamber may increase at a rate of about 7.5° C. per minute until a second temperature (e.g., about 900° C.) is reached. In example embodiments of the present invention, the oxygen gas may be introduced into the reaction chamber, after the nitrogen gas introduced in the preceding operation is purged. In other example embodiments of the present invention, the nitrogen gas and the oxygen gas may be simultaneously introduced into the reaction chamber.

In example embodiments of the present invention, while the oxygen gas is introduced into the reaction chamber, a temperature of the reaction chamber may increase until the second temperature is reached. A first oxidation process may occur when the oxygen gas has an increased concentration.

Figure 2:
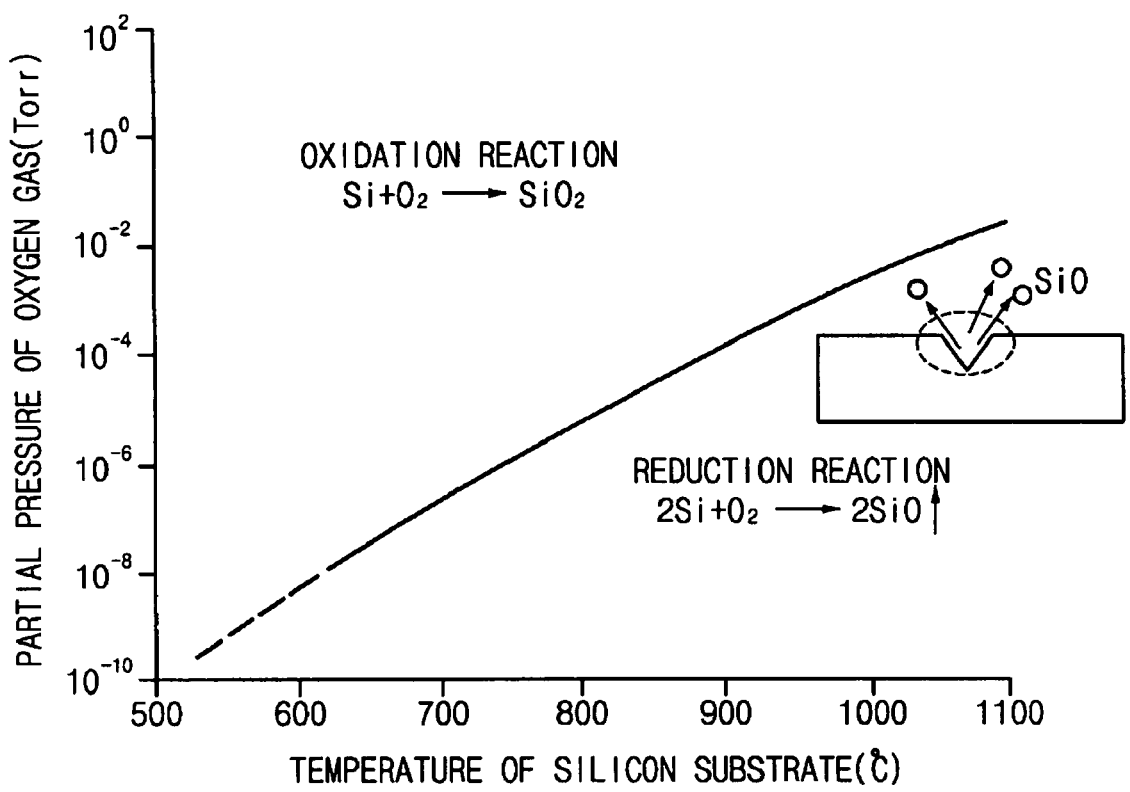

As shown in FIG. 2, as the temperature of the semiconductor substrate 100 increases, the partial pressure of the oxygen gas necessary for the oxidation process is augmented. When the inner temperature of the reaction chamber increases to about 900° C. and the partial pressure of the oxygen gas is greater, oxygen radicals may be produced from the oxygen gas such that the first oxidation process (e.g., the process in which the oxygen radical is reacted with the silicon atoms on the semiconductor substrate 100) occurs. As a result, the pitting on a surface of the semiconductor substrate 100 may be suppressed and/or the oxide layer 116 having a relatively thinner thickness may be formed on the gate electrode 115.

When the first oxidation process is performed under an increased concentration of the oxygen gas, the metal silicide layer pattern 100 may be suppressed from expanding at the surface thereof because the surface of the gate electrode 115 is passivated under the nitrogen atmosphere at S54.

After the inner temperature of the reaction chamber increases to about 900° C., the nitrogen gas may be introduced into the reaction chamber having a temperature of about 900° C. while the oxygen gas is not being supplied into the reaction chamber. A temperature deviation in the reaction chamber may be reduced at S58. The nitrogen gas may be introduced into the reaction chamber to passivate a surface of the gate electrode 115 having the stacked structure under the nitrogen atmosphere.

At S60, the oxygen gas and the hydrogen gas may be introduced into the reaction chamber for a desired time after the nitrogen gas is no longer supplied to the reaction chamber. When the oxygen gas is introduced into the reaction chamber followed by the hydrogen gas, a second oxidation process occurs wherein the oxygen gas and the hydrogen gas may be activated into oxygen radicals and hydrogen radicals. As shown in FIG. 5, the oxide layer 116, formed on the semiconductor substrate 100 and the gate electrode 115 by the first oxidation process, may function as a blocking layer to prevent or reduce pitting of the semiconductor substrate 100. The oxide layer 116 having a desired thickness may be formed depending on a volume expansion characteristic of the oxide layer.

In the radical oxidation process, the oxygen gas may be used as a source gas. The oxygen gas may be the only source of gas. In other example embodiments of the present invention, both the oxygen gas and the hydrogen gas may be used as a source of gas. When the hydrogen gas functions as the source gas, the hydrogen gas may increase a number of the activated radicals produced, increasing the quality of the oxide layer 116.

After the hydrogen gas and the oxygen gas are no longer being supplied to the reaction chamber, the nitrogen gas may be introduced into the reaction chamber. The oxide layer 116 may be thermally treated to increase structural characteristics of the oxide layer 116 at S62.

The inner temperature of the reaction chamber may decrease at a rate of about 30° C. per minute until a temperature of about 600° C. is reached at S64.

When the reaction chamber has the inner temperature of about 600° C., the semiconductor substrate 100 may be unloaded from the reaction chamber while the nitrogen gas is continuously introduced into the reaction chamber at S66.

According to example embodiments of the present invention described with reference to the above-described process, the process temperature may be adjusted by augmenting the inner temperature of the reaction chamber by increasing the inner temperature of the reaction chamber.

The formation of a hump on the side wall of the gate electrode may be prevented or reduced because the surface of the gate electrode is passivated under the nitrogen atmosphere by providing the nitrogen gas into the reaction chamber.

The first oxidation process may be performed while increasing the concentration of the oxygen gas. The concentration of the oxygen gas may be increased by introducing the oxygen gas into the reaction chamber. As such, pitting of the semiconductor substrate may be suppressed and/or the oxide layer having a relatively thinner thickness may be formed because the oxygen gas has an increased concentration.

When the second oxidation process is performed, the relatively thinner oxide layer may function as a blocking layer to prevent or reduce the semiconductor substrate 100 from pitting. The relatively thinner oxide layer may have a volume expansion sufficient to form an oxide layer having a desired thickness such that the semiconductor substrate and sidewall of the gate electrode may be cured or repaired and/or the gate electrode may be rounded off at a lower edge portion thereof.

According to example embodiments the present invention, a process temperature for a radical oxidation process may be adjusted, or altered, by increasing the inner temperature of a reaction chamber through the following operations.

A surface of the gate electrode may be passivated under the nitrogen atmosphere by introducing a nitrogen gas into the reaction chamber. The first oxidation process may be performed while increasing the concentration of the oxygen gas. The concentration of the oxygen gas may be increased by introducing the oxygen gas into the reaction chamber.

The formation of a hump at the sidewall of the gate electrode may be prevented or reduced. In addition, pitting of the semiconductor substrate may be suppressed.

The foregoing is illustrative of example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of example embodiments of the present invention and is not to be construed as limited to the specific embodiments disclosed, and that modifications to the disclosed embodiments, as well as other embodiments, are intended to be included within the scope of the appended claims. The example embodiments of present invention are defined by the following claims, with equivalents of the claims to be included therein.

What is claimed is:

1. A method of manufacturing a semiconductor device, comprising:
   forming a gate electrode on a semiconductor substrate; and
   forming an oxide layer on the semiconductor substrate and the gate electrode by a radical re-oxidation process to repair damage in the semiconductor substrate and the gate electrode,
   wherein the radical re-oxidation process includes:
   nitrogen-passivating a surface of the gate electrode under a nitrogen gas atmosphere by providing a nitrogen gas onto the semiconductor substrate while increasing a temperature of the semiconductor substrate to a first temperature,
   performing a first radical oxidation process by providing an oxygen gas onto the semiconductor substrate while increasing the temperature of the semiconductor substrate from the first temperature to a second temperature, after nitrogen-passivating the surface of the gate electrode, and
   performing a second radical oxidation process at the second temperature.

2. The method of claim 1, wherein the gate electrode includes a metal silicide layer.

3. The method of claim 1, wherein the nitrogen gas is provided onto the semiconductor substrate at a flow rate of about 30 slm or greater.

4. The method of claim 1, wherein the first temperature is about 900° C. or less.

5. The method of claim 1, wherein the second temperature is about 900° C. or greater.

6. The method of claim 1, wherein the re-oxidation process includes providing the nitrogen gas onto the semiconductor substrate at the second temperature after the oxygen gas is no longer being provided onto the semiconductor substrate, prior to performing the second radical oxidation process.

7. The method of claim 1, wherein performing the second radical oxidation process includes continuously providing the oxygen gas and the nitrogen gas onto the semiconductor substrate.

8. The method of claim 1, wherein the damage in the gate electrode includes damage in a sidewall of the gate electrode.

9. The method of claim 1, further comprising:
   loading the semiconductor substrate into a reaction chamber, before forming the oxide layer;
   wherein the nitrogen and the oxygen gases are provided onto the semiconductor substrate by introducing the gases into the reaction chamber, and the temperature of the semiconductor substrate is increased by increasing the temperature of the reaction chamber.

10. The method of claim 9, wherein the gate electrode includes a metal silicide layer.

11. The method of claim 9, wherein the nitrogen gas is introduced into the reaction chamber at a flow rate of about 30 slm or greater.

12. The method of claim 9, wherein the first temperature is about 900° C. or less.

13. The method of claim 9, wherein the second temperature is about 900° C. or greater.

14. The method of claim 9, further comprising providing the nitrogen gas into the reaction chamber after the oxygen gas is no longer being introduced into the reaction chamber at the second temperature, prior to performing the second radical oxidation process.

15. The method of claim 9, wherein performing the second radical oxidation process includes continuously introducing an oxygen gas and a nitrogen gas into the reaction chamber.

16. The method of claim 9, wherein the damage in the gate electrode includes damage in a sidewall of the gate electrode.

17. The method of claim 1, wherein the gate electrode has a stacked structure including a tunnel oxide layer pattern, a floating gate, a dielectric interlayer pattern and a control gate.

18. The method of claim 17, wherein the nitrogen gas is provided onto the semiconductor substrate at a flow rate of about 30 slm or greater.

19. The method of claim 17, wherein the first temperature is about 900° C. or less.

20. The method of claim 17, wherein the second temperature is about 900° C. or greater.

21. The method of claim 17, wherein the gate electrode includes a hard mask pattern formed on the control gate.

22. The method of claim 17, wherein the damage in the gate electrode includes damage in a sidewall of the gate electrode.

* * * * *